United States Patent
Oh et al.

(10) Patent No.: US 8,269,304 B2
(45) Date of Patent: Sep. 18, 2012

(54) MOS GATE POWER SEMICONDUCTOR DEVICE WITH ANODE OF PROTECTION DIODE CONNECTED TO COLLECTOR ELECTRODE

(75) Inventors: Kwang-Hoon Oh, Seoul (KR); Byoung-Ho Choo, Bucheon-si (KR); Soo-Seong Kim, Seoul (KR); Chong-Man Yun, Seoul (KR)

(73) Assignee: Trinno Technology Co., Ltd., Anyang-si (KR)

( * ) Notice: Subject to any disclaimer, the term of this patent is extended or adjusted under 35 U.S.C. 154(b) by 225 days.

(21) Appl. No.: 12/705,246

(22) Filed: Feb. 12, 2010

(65) Prior Publication Data

US 2011/0062490 A1 Mar. 17, 2011

(30) Foreign Application Priority Data

Sep. 11, 2009 (KR) .................. 10-2009-0085816

(51) Int. Cl.
*H01L 21/761* (2006.01)

(52) U.S. Cl. ........ 257/501; 257/341; 257/401; 257/500; 257/502; 257/578

(58) Field of Classification Search ............... 257/341, 257/401, 500–502, 578
See application file for complete search history.

(56) References Cited

U.S. PATENT DOCUMENTS

| | | | |
|---|---|---|---|
| 5,767,562 A | 6/1998 | Yamashita | |
| 2006/0261391 A1* | 11/2006 | Nakazawa et al. | 257/296 |
| 2006/0275980 A1* | 12/2006 | Sakakibara et al. | 438/253 |
| 2007/0126038 A1* | 6/2007 | Kobayashi | 257/288 |
| 2009/0095979 A1* | 4/2009 | Saito et al. | 257/177 |
| 2009/0114980 A1* | 5/2009 | Pang | 257/328 |
| 2009/0127624 A1* | 5/2009 | Sumitomo et al. | 257/350 |
| 2009/0212321 A1* | 8/2009 | Hsieh | 257/139 |

FOREIGN PATENT DOCUMENTS

KR 10-0210983 B1 7/1999

* cited by examiner

*Primary Examiner* — Fernando L Toledo
*Assistant Examiner* — Peter Bradford
(74) *Attorney, Agent, or Firm* — Birch, Stewart, Kolasch & Birch, LLP

(57) ABSTRACT

A MOS-gate power semiconductor device includes: a main device area including an active area and an edge termination area; and an auxiliary device area horizontally formed outside the main device area so as to include one or more diodes. Accordingly, it is possible to protect a circuit from an overcurrent and thus to prevent deterioration and/or destruction of a device due to the overcurrent.

10 Claims, 9 Drawing Sheets

Vg : Voltage of Gate-Emitter

MOS GATE POWER SEMICONDUCTOR DEVICE WITH ANODE OF PROTECTION DIODE CONNECTED TO COLLECTOR ELECTRODE

BACKGROUND

1. Technical Field

The present invention relates to a semiconductor device, and more particularly, to a MOS-gate power semiconductor device.

2. Description of the Related Art

Semiconductor devices such as an insulated gate bipolar transistor (IGBT) and a metal-oxide semiconductor field effect transistor (MOSFET) are mainly used as switching devices in the field of power electronic applications. That is, the semiconductor devices are used as semiconductor switching devices in the power electronic applications such as an H-bridge inverter, a half-bridge inverter, a 3-phase inverter, a multi-level inverter, and a converter.

However, in power electronic circuits including the semiconductor switching devices (that is, semiconductor devices used as the semiconductor switching devices), the semiconductor switching devices may happen to be deteriorated or destructed by the overcurrent flow due to a malfunction of driving circuitry. Accordingly, it is necessary to avoid such failures due to the overcurrent and moreover to prevent the deterioration and/or destruction of the semiconductor switching devices.

Hereinafter, operations of an H-bridge inverter circuit employing the semiconductor switching devices will be described along with a shoot-through phenomenon as an example of the failure in the circuit.

FIGS. 1A and 1B are a circuit diagram illustrating the H-bridge inverter circuit employing the IGBT and a graph illustrating its gate voltage and load voltage characteristics, respectively.

As shown in FIG. 1A, the H-bridge inverter circuit includes four semiconductor switching devices M1 to M4 and a load 120 connected to an output node 110 between the semiconductor switching devices. The IGBTs are shown as the semiconductor switching devices in FIG. 1A, but semiconductor switching devices such as MOSFETs may be also employed.

The semiconductor switching devices M1 to M4 included in the H-bridge inverter circuit are alternately turned on and off in a switching sequence to supply AC power to the load 120 connected to the output node 110 between the semiconductor switching devices. Here, each pair of semiconductor switching devices is called arm or leg.

When the semiconductor switching devices M1 and M3 are turned on and the semiconductor switching devices M2 and M4 are turned off under the control of a driving circuit for the semiconductor switching devices, a current flows in the direction of A. On the contrary, when the semiconductor switching devices M2 and M4 are turned on and the semiconductor switching devices M1 and M3 are turned off, the current flows in the direction of B.

Accordingly, as shown in FIG. 1B, when the semiconductor switching devices M1 and M3 are maintained in the ON state for a half of a switching period T and the semiconductor switching devices M2 and M4 are maintained in the ON state for the other half of the switching period T, the output voltage to the load 120 has a shape of AC voltage of which the polarity varies. In this way, when the turning-on/off operations of the semiconductor switching devices are normally controlled by the driving circuit, the current in the direction of A or B flows into the load.

Therefore, it is indispensable to control the semiconductor switching devices M1 and M4 (or M2 and M3) disposed in the same arm not to simultaneously be in the ON state. As shown in FIG. 1B, the semiconductor switching devices are controlled to have a dead time between the turning-off of M1 and the turning-on of M4 or between the turning-off of M4 and the turning-on of M1 (which is true in M2 and M3).

Otherwise, a short circuit is formed between the semiconductor switching devices disposed in the same aim to cause the shoot-through phenomenon, when the semiconductor switching devices disposed in the same arm are simultaneously in the ON state. That is, a very large short circuit current flows through the formed short circuit, which causes the deterioration and/or destruction of the semiconductor switching devices.

FIG. 2 is a plan view illustrating a known semiconductor switching device and FIG. 3 is a sectional view taken along line a-b of FIG. 2.

Referring to FIGS. 2 and 3, a semiconductor substrate 200 formed of silicon has a top surface and a bottom surface opposed to each other. A gate pad electrode 210, an active area 220 including plural cells allowing a current to flow, and an edge termination area 230 supporting a high withstand voltage are formed in the top surface. A collector metal electrode 310 is formed in the bottom surface. Unit cells including a gate poly electrode and an emitter metal electrode are arranged in the active area 220. A gate bus line 240 electrically connected to a gate pad to transmit a gate signal extends around the active area 220 from the gate pad electrode 210. For example, the gate bus line 240 can be formed in a closed loop, but the pattern is not limited to the closed loop. In this specification, an area having the gate pad electrode 210 formed therein is included as an area in the active area 220.

Referring to FIG. 3 showing a sectional view taken along line a-b of FIG. 2, when the semiconductor switching device is an IGBT, plural P-type wells 320 and 322 are formed in an N-type semiconductor substrate 315 and N-type wells 325 are selectively formed in the P-type wells 322. The P-type well 322 forms an active cell along with a gate oxide film 330 and a gate poly electrode 335. A channel can be formed in the P-type well 322, allowing a current to flow by connecting the semiconductor substrate 315 to the N-type well 325, when a gate voltage having a predetermined level is applied to a gate metal electrode 210. An insulating interlayer 340 is formed to include the gate poly electrode 335 therein and an emitter metal electrode 345 including active cells is formed thereon. A collector region 350 is formed under the N-type semiconductor substrate 315 and a collector metal electrode 310 is formed under the collector region 350 by a bottom metal process. The collector region 350 is formed in a P type in case of the IGBT, and is formed in an N type as a drain region in case of the MOSFET.

When the semiconductor device shown in FIG. 3 is the semiconductor switching device M4 shown in FIG. 1A, the collector metal electrode 310 is electrically connected to the output node 110 and the emitter metal electrode 345 is electrically connected to a—terminal of an input voltage. Accordingly, when the semiconductor switching device is in the ON state, the current flows from the output node 110 to the—terminal of the input voltage.

In an abnormal state such as the above-mentioned shoot-through phenomenon, an overcurrent flows to the outside via the emitter metal electrode 345, which can cause the deterioration and/or destruction of the semiconductor switching device.

To prevent the shoot-through phenomenon, the semiconductor devices are controlled with the dead time. However, the possibility that the shoot-through phenomenon occurs cannot be completely excluded in various abnormal states where the control sequence of the driving circuit is not normally designed or the driving circuit for the semiconductor switching devices operates erroneously.

Particularly, since a tail current exists due to the characteristic of the IGBT, a sufficient dead time is required for preventing the shoot-through phenomenon. However, the elongation of the dead time causes an increase in harmonics due to the distortion in output waveform of an inverter, thereby lowering the performance of the inverter.

Therefore, there is a need for developing a semiconductor switching device which can protect a circuit and the semiconductor switching device itself in an abnormal state such as the shoot-through phenomenon.

The above-mentioned background art is technical information thought out to make the invention or learned in the course of making the invention by the inventor, and cannot be thus said to be technical information known to the public before filing the invention.

SUMMARY

An advantage of some aspects of the invention is that it provides a MOS-gate power semiconductor device which can protect a circuit and a semiconductor switching device in an abnormal state of the circuit.

Another advantage of some aspects of the invention is that it provides a MOS-gate power semiconductor device which can fundamentally suppress a shoot-through phenomenon from occurring in an inverter circuit.

Another advantage of some aspects of the invention is that it provides a MOS-gate power semiconductor device which can allow a decrease in weight, thickness, and size of a power electronic circuit by integrating a diode performing a protection operation in a semiconductor switching device.

Other advantages of the invention will be easily understood from the following description.

According to an aspect of the invention, there is provided a MOS-gate power semiconductor device including: a main device area including an active area and an edge termination area; and an auxiliary device area horizontally formed outside the main device area so as to include one or more diodes.

The anode electrodes and the cathode electrodes of the diodes may be exposed from the surface of the auxiliary device area.

The MOS-gate power semiconductor device may further include: a plurality of second conductive-type wells formed in a first conductive-type semiconductor substrate; and one or more first conductive-type wells formed in the second conductive type wells located in the auxiliary device area out of the plurality of second conductive-type wells. Here, the second conductive-type wells may be electrically connected to one or more anode electrodes and the first conductive-type wells may be electrically connected to one or more cathode electrodes.

The first conductive-type wells may be formed using N-type ions and the second conductive-type wells may be formed using P-type ions.

A main collector region may be formed on the bottom of the first conductive-type semiconductor substrate. Here, the MOS-gate power semiconductor device may serve as an insulated gate bipolar transistor (IGBT) when the main collector region is formed using P-type ions, and may serve as a metal-oxide semiconductor field effect transistor (MOSFET) when the main collector region is formed using N-type ions.

A collector electrode under the main collector region may be electrically connected to one or more anode electrodes.

The cathode electrodes may be electrically connected to the first conductive-type semiconductor substrate.

One or more cathode electrodes may be electrically connected to an auxiliary collector region formed in the first conductive-type semiconductor substrate.

The MOS-gate power semiconductor device may serve as an insulated gate bipolar transistor (UM) when the auxiliary collector region is formed using P-type ions, and may serve as a metal-oxide semiconductor field effect transistor (MOSFET) when the auxiliary collector region is formed using N-type ions.

According to another aspect of the invention, there is provided a MOS-gate power semiconductor device including an active area, an edge termination area, and a peripheral area which are partitioned from each other, including: a first semiconductor switching device controlling a current flowing from a collector electrode formed on a bottom surface to the active area; and a second semiconductor switching device controlling a current flowing from an auxiliary collector region formed in a first conductive-type semiconductor substrate to the active area. Here, the collector electrode is electrically connected to a main collector region formed in the first conductive-type semiconductor substrate, and corresponding anode electrodes and corresponding cathode electrodes of one or more diodes are disposed in the peripheral area horizontally formed outside the edge termination area, the anode electrodes are electrically connected to the collector electrode, and the cathode electrodes are electrically connected to the auxiliary collector region.

The MOS-gate power semiconductor device may further include: a plurality of second conductive-type wells formed in a first conductive-type semiconductor substrate; and one or more first conductive-type wells formed in the second conductive type well located in the peripheral area out of the plurality of second conductive-type wells. Here, the second conductive-type wells may be electrically connected to one or more anode electrodes and the first conductive-type wells may be electrically connected to one or more cathode electrodes.

The first conductive-type wells may be formed using N-type ions and the second conductive-type wells may be formed using P-type ions.

The first semiconductor switching device may serve as an insulated gate bipolar transistor (IGBT) when the main collector region is formed using P-type ions, and may serve as a metal-oxide semiconductor field effect transistor (MOSFET) when the main collector region is formed using N-type ions.

The second semiconductor switching device may serve as an insulated gate bipolar transistor (IGBT) when the auxiliary collector region is formed using P-type ions, and may serve as a metal oxide semiconductor field effect transistor (MOSFET) when the auxiliary collector region is formed using N-type ions.

According to the aspects of the invention, it is possible to protect a circuit and a semiconductor switching device in an abnormal state of the circuit.

It is also possible to fundamentally suppress a shoot-through phenomenon from occurring in an inverter circuit.

It is also possible to allow a decrease in weight, thickness, and size of a power electronic circuit by integrating a diode performing a protection operation in a semiconductor switching device.

DESCRIPTION OF EXEMPLARY EMBODIMENTS

Figure 1A:
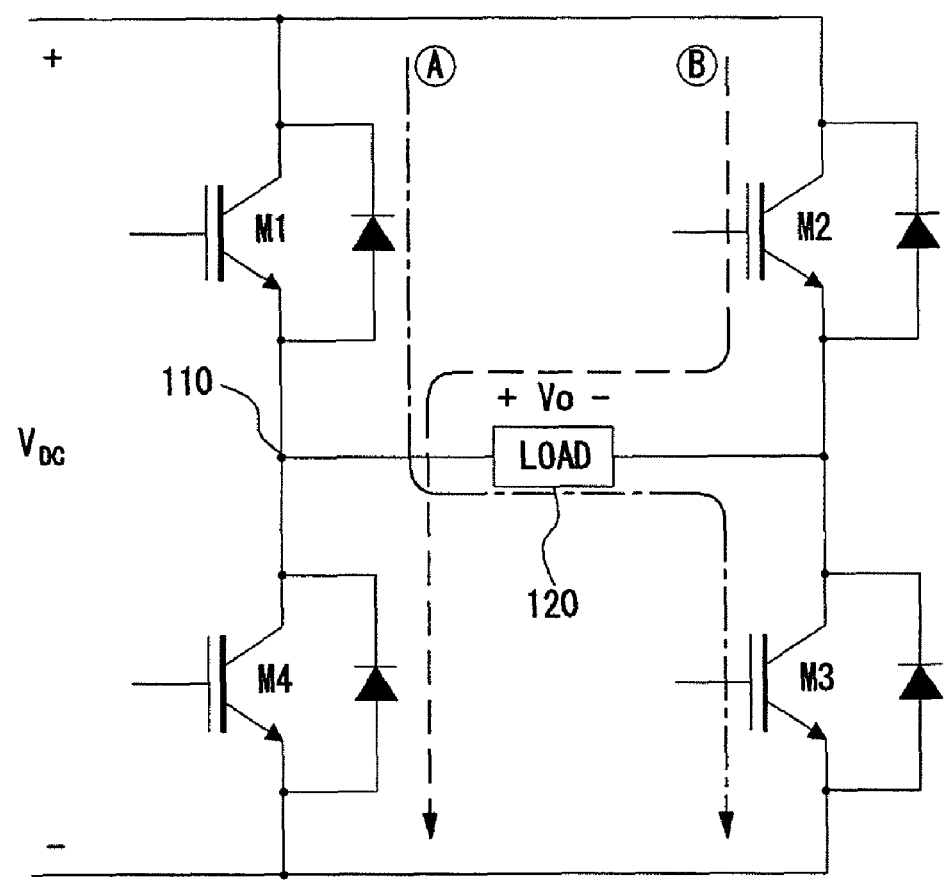
FIGS. 1A and 1B are a circuit diagram illustrating a H-bridge inverter circuit employing a known IGBT and a graph illustrating its gate voltage and load voltage characteristics.

The invention can be variously modified in various forms and specific embodiments will be described and shown in the drawings. However, the embodiments are not intended to limit the invention, but it should be understood that the invention includes all the modifications, equivalents, and replacements belonging to the spirit and the technical scope of the invention. When it is determined that detailed description of known techniques associated with the invention makes the gist of the invention obscure, the detailed description will be omitted.

Terms such as "first" and "second" can be used to describe various elements, but the elements are not limited to the terms. The terms are used only to distinguish one element from another element.

The terms used in the following description are used to merely describe specific embodiments, but are not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should be thus understood that the possibility of existence or addition of one or more different features, numbers, steps, operations, elements, components, or combinations thereof is not excluded.

If it is mentioned that an element such as a layer, a region, and a substrate is disposed "on" another element or extends "onto" another element, it should be understood that the element is disposed directly on another element or extends directly onto another element, or still another element is interposed therebetween. On the contrary, if it is mentioned that an element is disposed "directly on" another element or extends "directly onto" another element, it should be understood that still another element is not interposed therebetween. If it is mentioned that an element is "connected to" or "coupled to" another element, it should be understood that still another element may be interposed therebetween, as well as that the element may be connected or coupled directly to another element. On the contrary, if it is mentioned that an element is "connected directly to" or "coupled directly to" another element, it should be understood that still another element is not interposed therebetween.

Relative terms such as "below", "above", "upper", "lower", "horizontal", "lateral", and "vertical" can be used to describe the relative relation of an element, layer, or region to another element, layer, or region as shown in the drawings. The terms are intended to include another direction of a device relative to an orientation shown in the drawings.

The exemplary embodiments of the invention will be described now in detail with reference to the accompanying drawings. Although an IGBT used as a semiconductor switching device in an H-bridge inverter circuit will be mainly described, a semiconductor switching device with the same technical spirit can be applied to various power electronics fields such as a half-bridge inverter, a 3-phase inverter, a multi-level inverter, and a converter without any particular restriction.

Figure 4:
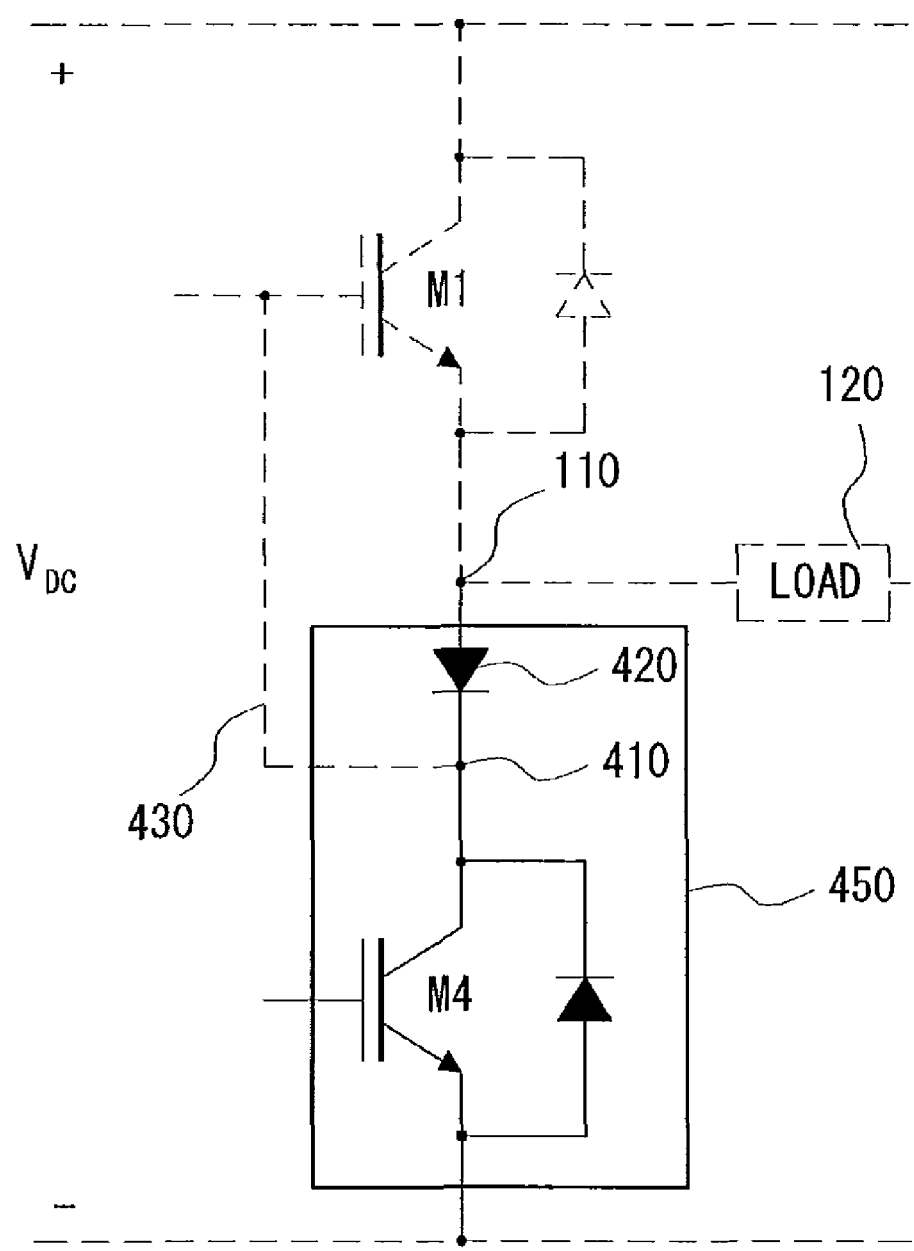
FIG. 4 is a circuit diagram conceptually illustrating an arm of an inverter circuit according to an embodiment of the invention.

FIG. 4 is a circuit diagram illustrating an arm of an inverter according to an embodiment of the invention.

As shown in FIG. 4, the arm of an inverter includes an upper semiconductor switching device M1 and a lower semiconductor switching device M4 connected in series to cross a power supply line. As shown in the drawing, the semiconductor switching devices are IGBT, but may be replaced with a power MOSFET.

An output node 110 supplying current to a load 120 is disposed between the upper semiconductor switching device M1 and the lower semiconductor switching device M4.

A diode 420 is interposed between the output node 110 and a connection node 410. The connection node 410 is connected to the gate terminal of the upper semiconductor switching device M1 via a conductive line 430. Accordingly, the diode 420 is disposed between the emitter terminal and the gate terminal of the upper semiconductor switching device M1 and between the emitter terminal of the upper semiconductor switching device M1 and the collector terminal of the lower semiconductor switching device M4. When the upper semiconductor switching device M1 and the lower semiconductor switching device M4 is a power MOSFET, the diode 420 is disposed between the source terminal and the gate terminal of the upper semiconductor switching device M1 and between the source terminal of the upper semiconductor switching device M1 and the drain terminal of the lower semiconductor switching device M4.

The diode 420 serves to turn off the upper semiconductor switching device M1 or to maintain the upper semiconductor switching device M1 in the OFF state, when a current flows through the lower semiconductor switching device M4. As described with reference to FIGS. 1A and 1B, the upper semiconductor switching device M1 is maintained in the OFF state when the current flows in the direction of B. Accordingly, it is possible to prevent the shoot-through phenomenon from occurring and thus to prevent the deterioration and/or destruction of the semiconductor switching devices M1 and M4 due to the overcurrent resulting from the shoot-through phenomenon.

For example, in an abnormal state of the circuit where two semiconductor switching devices disposed in one arm are simultaneously turned on, the gate potential of the upper semiconductor switching device M1 is lower than the emitter potential due to the voltage drop (about 0.7 V) due to the turning-on of the diode 420. Accordingly, the gate potential of the upper semiconductor switching device M1 is not maintained to be equal to or greater than a threshold voltage and the upper semiconductor switching device M1 is forcibly turned off, thereby preventing the shoot-through phenomenon.

It is preferable that the breakdown voltage of the diode is set to be equal to or greater than the gate oxide breakdown voltage of the semiconductor switching device and the forward voltage drop at the time of turning on the diode is small.

Figure 5:
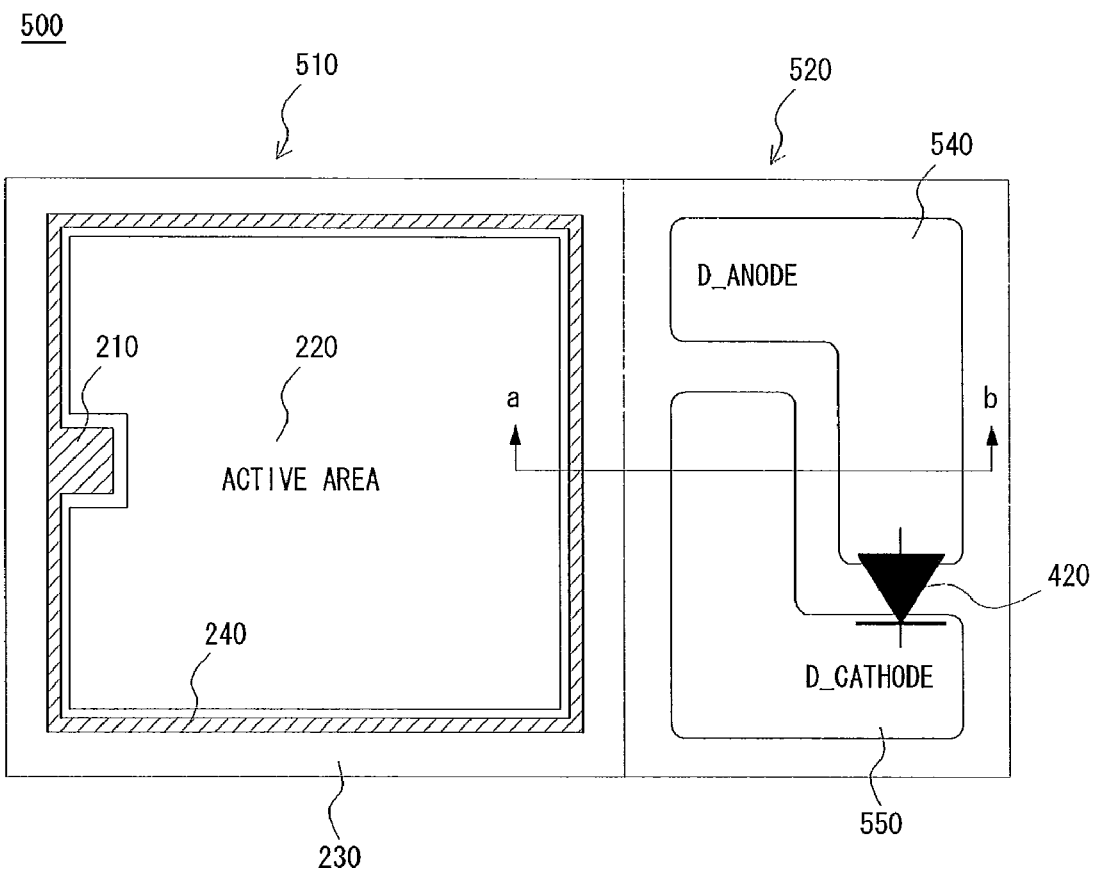
FIG. 5 is a plan view illustrating a semiconductor switching device according to an embodiment of the invention.

The lower semiconductor switching device 450 shown in FIG. 5 will become clearer from the following description of the structure and the circuit diagram of a semiconductor switching device according to an embodiment of the invention.

Figure 6:
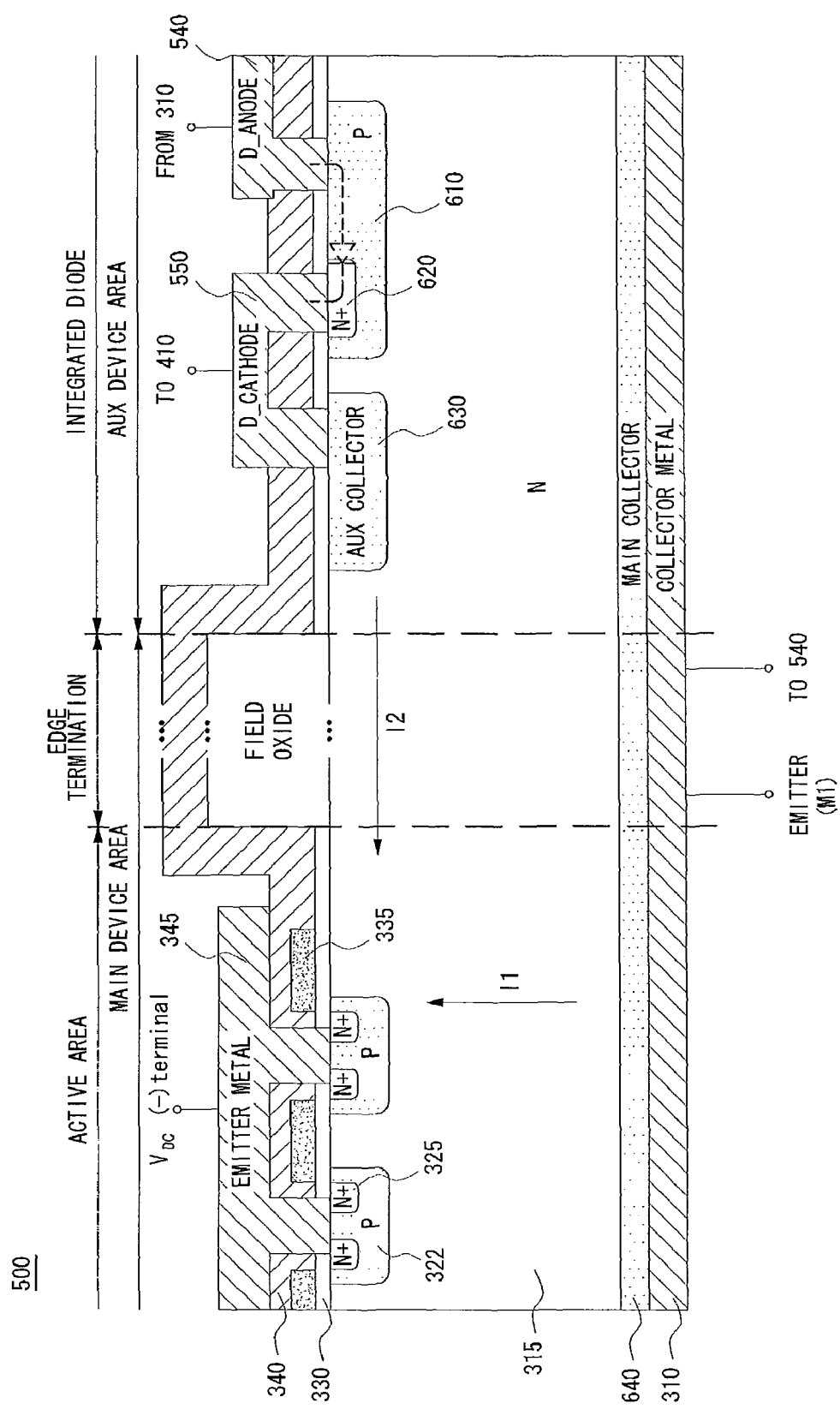
FIG. 6 is a sectional view taken along line a-b of FIG. 5 according to an embodiment of the invention.
Figure 7:
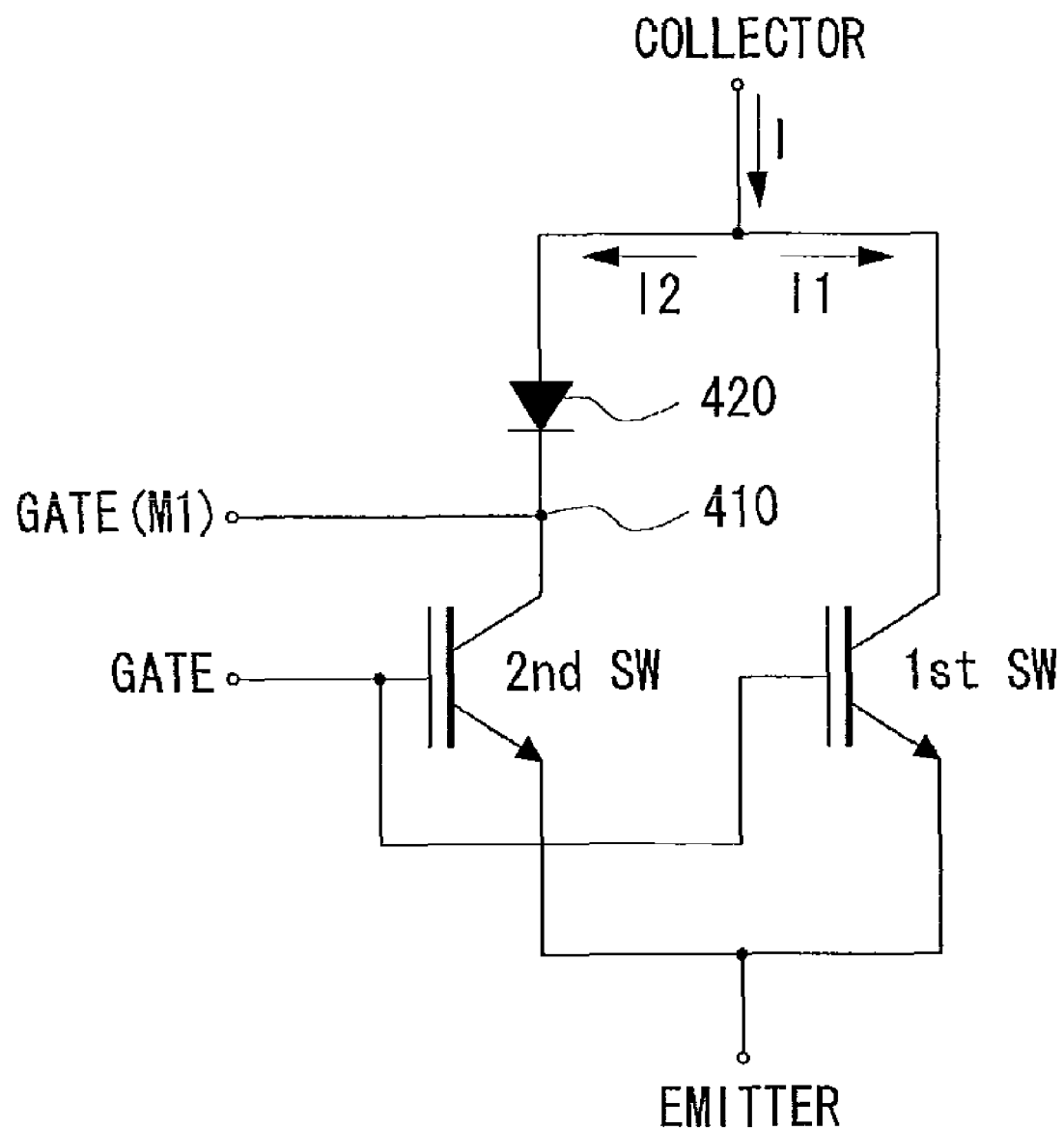
FIGS. 7 and 8 are equivalent circuit diagrams of the semiconductor switching devices according to the embodiments of the invention.
Figure 8:
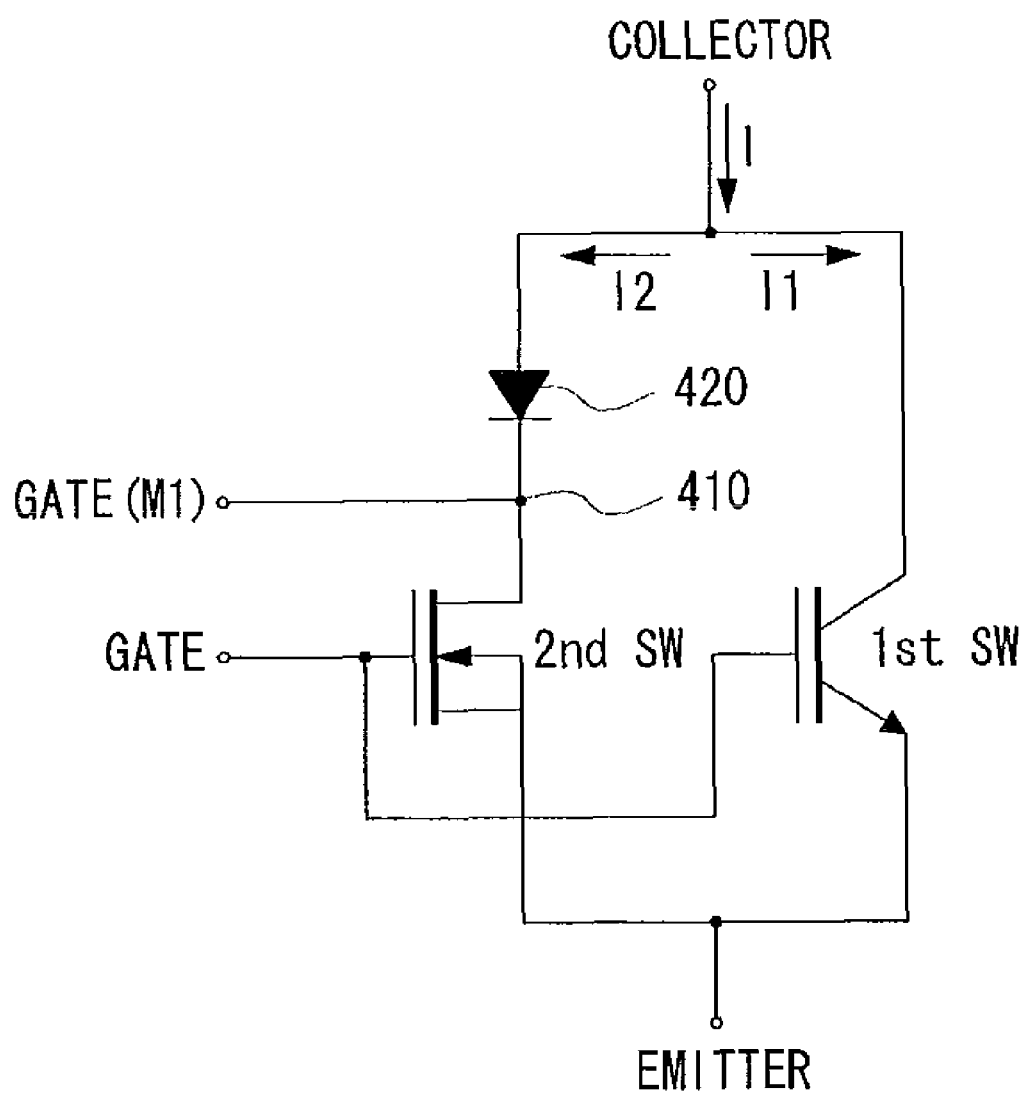

FIG. 5 is a plan view illustrating a semiconductor switching device according to an embodiment of the invention. FIG. 6 is a sectional view taken along line a-b of FIG. 5 according to an embodiment of the invention. FIGS. 7 and 8 are equivalent circuit diagrams of the semiconductor switching devices according to the embodiments of the invention.

Referring to FIG. 5, a gate pad electrode 210, an active area 220, an edge termination area 230, and a peripheral area are formed in the top surface of a semiconductor switching device 500. For the purpose of convenient explanation, an area including the gate pad electrode 210, an active area 220, and an edge termination area 230 is called main device area 510 and a peripheral area thereof is called auxiliary device area 520.

The main device area 510 is an area in which a known semiconductor switching device is formed and can include, for example, the gate pad electrode 210, the active area 220 including plural cells allowing a current flow, and the edge termination area 230 supporting a high withstand voltage.

An anode electrode 540 and a cathode electrode 550 used to integrate a diode 420 in the semiconductor switching device 500 are formed in the auxiliary device area 520 (that is, the peripheral area) formed outside the edge termination area 230 of the main device area 510. The anode electrode 540 and the cathode electrode 550 are electrically isolated from each other. The anode electrode 540 is connected to the collector metal electrode 310 formed on the bottom surface via a wire. The wire electrically connecting the anode electrode 540 to the collector metal electrode 310 can be arranged to connect both inside a package. In the drawings, D ANODE represents the built-in anode of the diode 420 and D CATHODE represents the built-in cathode of the diode 420. The shapes of the anode electrode 540 and the cathode electrode 550 are not particularly limited. While the anode electrode 540 and the cathode electrode 550 of each diode 420 are illustrated in FIG. 5, plural anode electrodes and plural cathode electrodes used to integrate plural diodes connected in parallel or in series or in parallel and series can be formed in the auxiliary device area 520.

Compared with FIG. 4, the anode electrode 540 is connected to the upper semiconductor switching device M1 via an external electric wire and the cathode electrode 550 is connected to the gate of the upper semiconductor switching device M1 via an external electric wire.

Referring to FIG. 6 which is a sectional view taken along line a-b of FIG. 5, plural P-type wells 322 are formed on an N-type semiconductor substrate 315 in the main device area 510 of the semiconductor switching device 500 and N-type wells 325 are selectively formed in the P-type wells 322. A channel can be formed in the P-type wells 322, allowing a current to flow by connecting the semiconductor substrate 315 to the N-type wells 325 when a gate voltage having a predetermined magnitude is applied to a gate metal electrode 210. An insulating interlayer 340 is formed to include a gate ploy electrode 335 therein and an emitter metal electrode 345 including active cells is formed thereon.

In the auxiliary device area 520 of the semiconductor switching device 500, a P-type well 610 serving as the anode of the diode 420 is formed on the N-type semiconductor substrate 315 and an N-type well 620 serving as the cathode of the diode 420 is formed in the P-type well 610. Here, one or more P-type wells 610 and one or more N-type wells 620 may be formed.

The P-type well 610 is electrically connected to an anode electrode 540 exposed from the top surface of the semiconductor switching device 500 and the N-type well 620 is electrically connected to a cathode electrode 550 exposed from the top surface of the semiconductor switching device 500. The cathode electrode 550 is electrically connected to an auxiliary collector region 630 electrically isolated from the P-type well 610 and the N-type well 620.

A current flows from the anode electrode 540 to the cathode electrode 550. The P-type well 610 and the N-type well 620 electrically connecting both electrodes serve as a PN-junction diode.

A main collector region 640 is formed under the N-type semiconductor substrate 315 and the collector metal electrode 310 is formed under the main collector region 640 by a bottom metal process.

According to the above-mentioned sectional structure, the semiconductor switching device 500 includes two switching devices as shown in FIG. 7. That is, the semiconductor switching device 50 includes a first semiconductor switching device allowing a current to flow from the main collector region 640 to the emitter metal electrode 345 (that is, in the current direction of I1) and a second semiconductor switching device allowing a current to flow from the auxiliary collector region 630 to the emitter metal electrode 345 (that is, in the current direction of I2).

Here, the first semiconductor switching device serves as an IGBT when the main collector region 640 is formed using P-type ions, and serves as a MOSFET when the main collector region 640 is formed using N-type ions. Similarly, the second semiconductor switching device serves as an IGBT when the auxiliary collector region 630 is formed using P-type ions, and serves as a MOSFET when the auxiliary collector region 630 is formed using N-type ions. When the second semiconductor switching device serves as the MOSFET, the concentration of the N-type ions forming the auxiliary collector region 630 is not necessarily different from the concentration of N-type ions of the N-type semiconductor substrate 315. When the concentration of N-type ions of the auxiliary collector region 630 is equal to the concentration of N-type ions of the N-type semiconductor substrate 315, the auxiliary collector region 630 may not be formed.

FIGS. 7 and 8 show equivalent circuit diagrams of the semiconductor switching device 500 shown in FIG. 6.

FIG. 7 is an equivalent circuit diagram when the auxiliary collector region 630 of the auxiliary device area 520 is formed using P-type ions and FIG. 8 is an equivalent circuit diagram when the auxiliary collector area 630 of the auxiliary device area 520 is formed N-type ions.

Figure 1B:
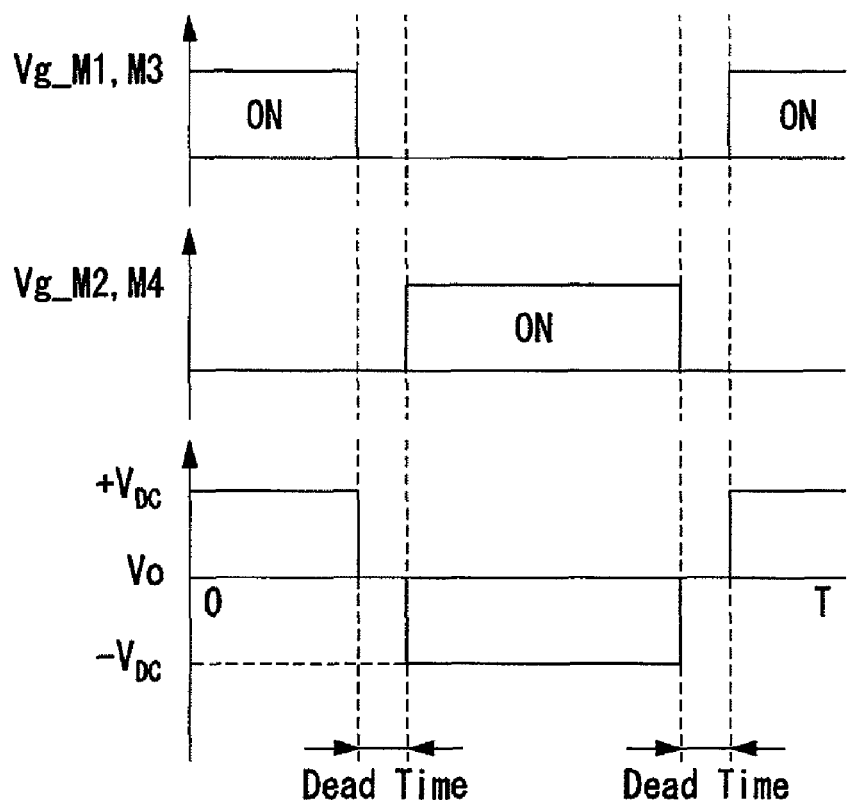
Figure 2:
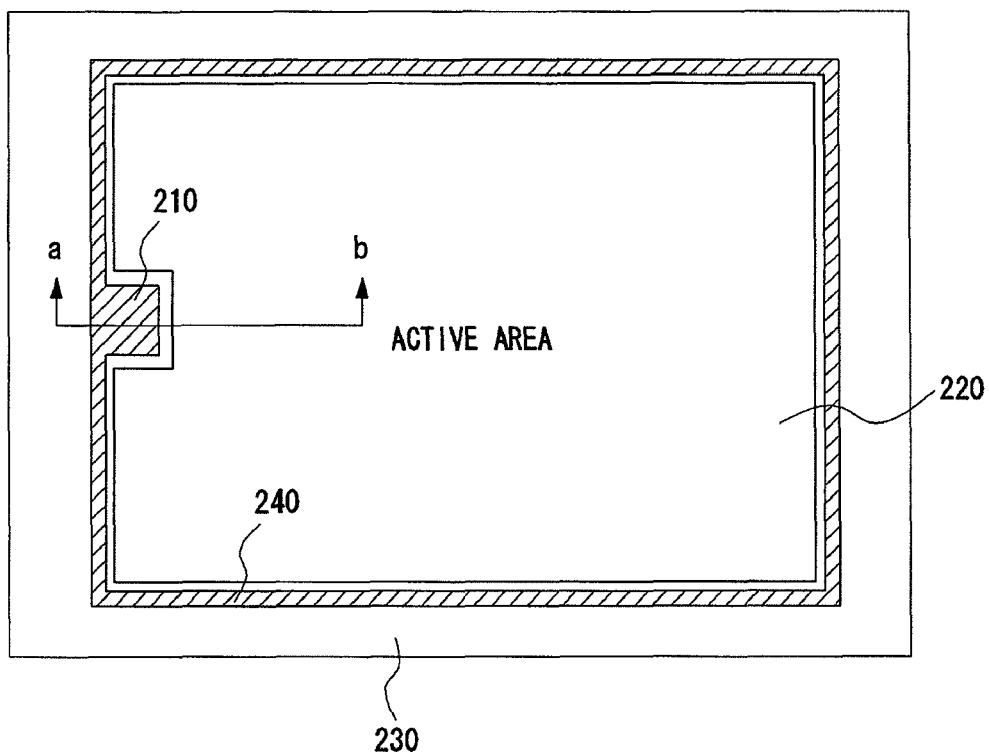
FIG. 2 is a plan view illustrating a known semiconductor switching device.
Figure 3:
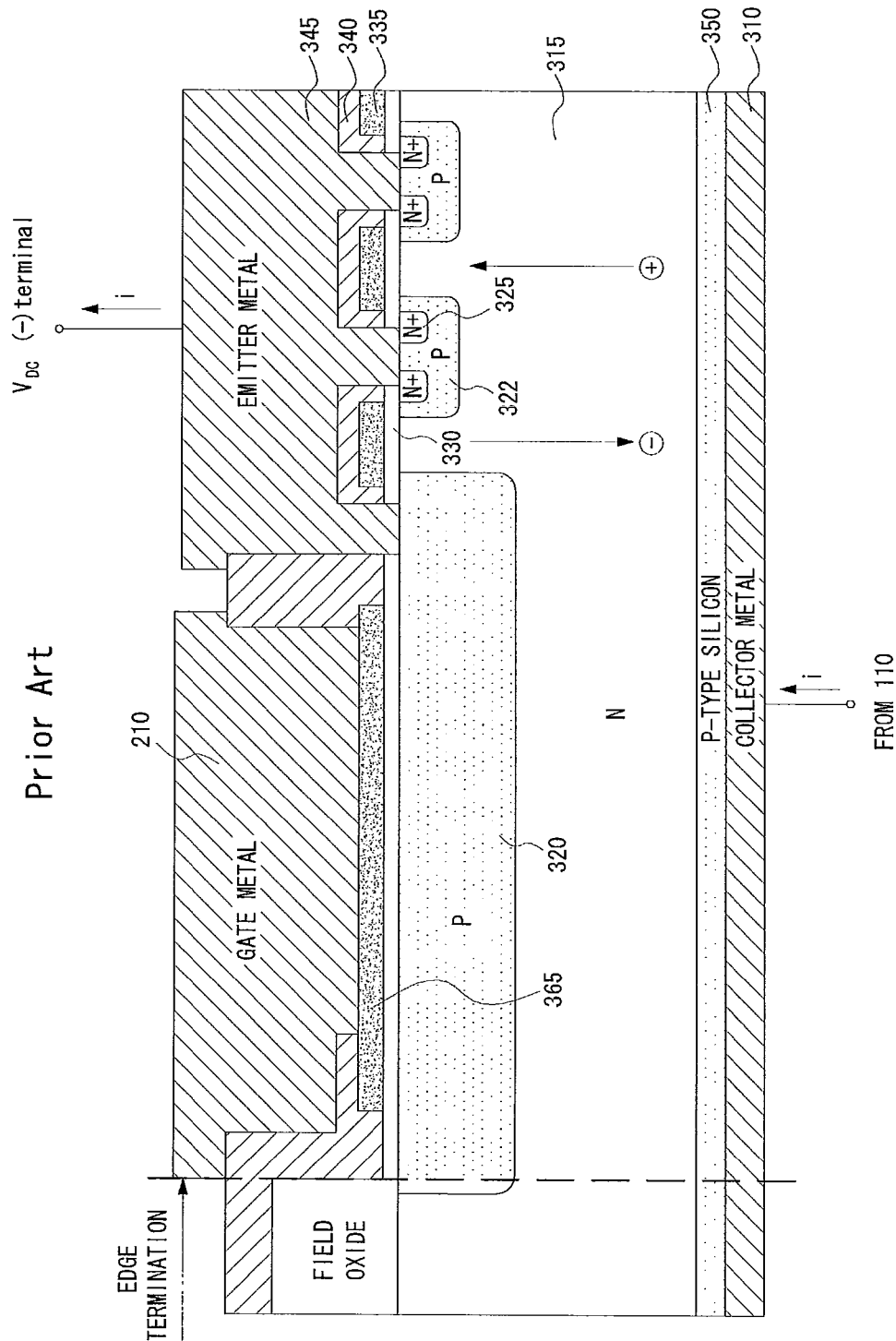
FIG. 3 is a sectional view taken along line a-b of FIG. 2.

Compared with the lower semiconductor switching device M4 shown in FIG. 1A, the semiconductor switching device 500 according to this embodiment includes one diode and two individual semiconductor switching devices. That is, the semiconductor switching device 500 includes a first semiconductor switching device (1' SW) controlling the current I1 flowing from the collector terminal to the emitter terminal, a diode 420 applying the current I2 input from the collector terminal to the auxiliary collector region 630 and causing a voltage drop in the course, and a second semiconductor switching device ($2^{nd}$ SW) controlling the current I2 flowing from the auxiliary collector region 630 to the emitter terminal. Here, the first semiconductor switching device is connected to the diode and the second semiconductor switching device connected in series to the diode.

Here, the current I input from the collector terminal is divided into the current I1 flowing to the first semiconductor switching device and the current I2 flowing to the second semiconductor switching device via the diode 420.

The current I2 causes a voltage drop in the diode 420 in the course of flowing through the diode. Accordingly, the gate potential of the upper semiconductor switching device M1 connected to the connection node 410 is lower than the emitter potential and the gate potential of the upper semiconductor switching device M1 is less than a threshold voltage, whereby the upper semiconductor switching device M1 is forcibly turned off or is maintained in the OFF state. Here, since the current I2 is smaller than the current I1, the loss in the diode due to the turning-on of the diode can be minimized.

Since the overcurrent is prevented from flowing into the lower semiconductor switching device M4 in an abnormal state such as a shoot-through phenomenon by the turning-off of the upper semiconductor switching device M1, it is possible to stabilize the circuit and to prevent the deterioration and/or destruction of the semiconductor switching device caused by the flow of the overcurrent.

While the invention is described with reference to the embodiments, it will be understood by those skilled in the art that the invention is modified and changed in various forms without departing from the spirit and scope of the invention described in the appended claims.

What is claimed is:

1. A MOS-gate power semiconductor device comprising:
    a main device area including an active area and an edge termination area;
    an auxiliary device area horizontally formed outside the main device area so as to include one or more diodes;
    a plurality of second conductive-type wells formed in a first conductive-type semiconductor substrate; and
    one or more first conductive-type wells formed in at least one of the plurality of second conductive-type wells located in the auxiliary device area,
    wherein anode electrodes and cathode electrodes of the one or more diodes are exposed from a surface of the auxiliary device area,
    wherein the second conductive-type wells are electrically connected to one or more anode electrodes and the first conductive-type wells are electrically connected to one or more cathode electrodes,
    wherein a main collector region is formed on a bottom of the first conductive-type semiconductor substrate,
    wherein the MOS-gate power semiconductor device serves as an insulated gate bipolar transistor (IGBT) when the main collector region is formed using P-type ions, and serves as a metal-oxide semiconductor field effect transistor (MOSFET) when the main collector region is formed using N-type ions,
    wherein a collector electrode is stacked on the main collector region, and
    wherein the collector electrode is electrically connected to the one or more anode electrodes.

2. The MOS-gate power semiconductor device according to claim 1, wherein the first conductive-type wells are formed using N-type ions and the second conductive-type wells are formed using P-type ions.

3. The MOS-gate power semiconductor device according to claim 1, wherein the one or more cathode electrodes are electrically connected to the first conductive-type semiconductor substrate.

4. The MOS-gate power semiconductor device according to claim 1, wherein the one or more cathode electrodes are electrically connected to an auxiliary collector region formed in the first conductive-type semiconductor substrate.

5. The MOS-gate power semiconductor device according to claim 4, wherein the MOS-gate power semiconductor device serves as an insulated gate bipolar transistor (IGBT) when the auxiliary collector region is formed using P-type ions, and serves as a metal-oxide semiconductor field effect transistor (MOSFET) when the auxiliary collector region is formed using N-type ions.

6. A MOS-gate power semiconductor device including an active area, an edge termination area, and a peripheral area which are partitioned from each other, comprising:
    a first semiconductor switching device controlling a current flowing from a collector electrode formed on a bottom surface to the active area; and
    a second semiconductor switching device controlling a current flowing from an auxiliary collector region formed in a first conductive-type semiconductor substrate to the active area,
    wherein the collector electrode is electrically connected to a main collector region formed in the first conductive-type semiconductor substrate, and
    wherein corresponding anode electrodes and corresponding cathode electrodes of one or more diodes are disposed in the peripheral area horizontally formed outside the edge termination area, the anode electrodes are electrically connected to the collector electrode, and the cathode electrodes are electrically connected to the auxiliary collector region.

7. The MOS-gate power semiconductor device according to claim 6, further comprising:
    a plurality of second conductive-type wells formed in a first conductive-type semiconductor substrate; and
    one or more first conductive-type wells formed in at least one of the plurality of second conductive type wells located in the peripheral area,
    wherein the second conductive-type wells are electrically connected to one or more anode electrodes and the first conductive-type wells are electrically connected to one or more cathode electrodes.

8. The MOS-gate power semiconductor device according to claim 7, wherein the first conductive-type wells are formed using N-type ions and the second conductive-type wells are formed using P-type ions.

9. The MOS-gate power semiconductor device according to claim 6, wherein the first semiconductor switching device serves as an insulated gate bipolar transistor (IGBT) when the main collector region is formed using P-type ions, and serves as a metal-oxide semiconductor field effect transistor (MOSFET) when the main collector region is formed using N-type ions.

10. The MOS-gate power semiconductor device according to claim 6, wherein the second semiconductor switching device serves as an insulated gate bipolar transistor (IGBT) when the auxiliary collector region is formed using P-type ions, and serves as a metal-oxide semiconductor field effect transistor (MOSFET) when the auxiliary collector region is formed using N-type ions.

* * * * *